US012725936B2

(12) United States Patent
Fujishima

(10) Patent No.: US 12,725,936 B2
(45) Date of Patent: Sep. 1, 2026

(54) ARRAY ANTENNA DEVICE

(71) Applicant: HIROSHIMA UNIVERSITY, Higashihiroshima (JP)

(72) Inventor: Minoru Fujishima, Higashihiroshima (JP)

(73) Assignee: HIROSHIMA UNIVERSITY, Hiroshima (JP)

( * ) Notice: Subject to any disclaimer, the term of this patent is extended or adjusted under 35 U.S.C. 154(b) by 66 days.

(21) Appl. No.: 18/841,290

(22) PCT Filed: Feb. 17, 2023

(86) PCT No.: PCT/JP2023/005785

§ 371 (c)(1),
(2) Date: Aug. 23, 2024

(87) PCT Pub. No.: WO2023/162887

PCT Pub. Date: Aug. 31, 2023

(65) Prior Publication Data

US 2025/0167458 A1 May 22, 2025

(30) Foreign Application Priority Data

Feb. 24, 2022 (JP) ................................ 2022-026801

(51) Int. Cl.
*H01Q 21/06* (2006.01)
*H01Q 3/42* (2006.01)
*H03D 7/16* (2006.01)

(52) U.S. Cl.
CPC ............. *H01Q 21/065* (2013.01); *H01Q 3/42* (2013.01); *H03D 7/165* (2013.01)

(58) Field of Classification Search
CPC ........ H01Q 21/065; H01Q 3/42; H03D 7/165; H04B 1/40; H04B 7/0617
See application file for complete search history.

(56) References Cited

U.S. PATENT DOCUMENTS 5,091,731 A 2/1992 Rees
10,944,180 B2 * 3/2021 Vigano ................ H01Q 3/2658
(Continued)

FOREIGN PATENT DOCUMENTS

CA 3186895 A1 12/2021
WO WO-2018024333 A1 * 2/2018 ............... H01Q 3/30
WO 2020/110814 A 6/2020

OTHER PUBLICATIONS

Extended European Search Report dated Apr. 16, 2025 as received in Application No. 23759888.3.

(Continued)

*Primary Examiner* — Seung H Lee
(74) *Attorney, Agent, or Firm* — Maschoff Brennan

(57) ABSTRACT

An array antenna device for use in a 300 GHz band includes a first layer in which antenna elements are arranged in a grid shape and a second layer stacked on the first layer. The second layer includes mixers that are arranged in grid regions overlapping the antenna elements in plan view, that each include an LO signal terminal, an IF signal terminal, and an RF signal terminal, with the RF signal terminals being electrically connected to the antenna elements. The second layer also includes LO signal lines provided to respective columns of the mixers. Each LO signal line is commonly connected to the LO signal terminal of the mixers of the same column. The second layer further includes IF signal lines provided to respective rows of the mixers. Each IF signal line is commonly connected to the IF signal terminal of the mixer of the same row.

11 Claims, 12 Drawing Sheets

(56) References Cited

U.S. PATENT DOCUMENTS

| | | | | |
|---|---|---|---|---|
| 2005/0116864 | A1 | 6/2005 | Mohamadi | |
| 2019/0245598 | A1 | 8/2019 | Ericsson | |
| 2019/0383898 | A1 | 12/2019 | Alidio | |
| 2020/0021411 | A1 | 1/2020 | Ren | |
| 2021/0005977 | A1 | 1/2021 | Franson et al. | |
| 2023/0123851 | A1* | 4/2023 | Wu ........................... | H03F 3/19<br>455/101 |

OTHER PUBLICATIONS

Hagiwara, Toyoyuki et al., “A 258-GHz CMOS Transmitter with Phase-Shifting Architecture for Phased-Array Systems”, 2021 IEEE MTT-S International Microwave Symposium (IMS), 2021, pp. 705-708, DOI: 10.1109IMS19712.2021.9574976.

* cited by examiner

ARRAY ANTENNA DEVICE

TECHNICAL FIELD

The present invention relates to a wireless device equipped with an array antenna, and more particularly, to an array antenna device suitable for use in a transceiver operating in the 300 GHz band.

BACKGROUND ART

FIG. 12 is a graph illustrating the relationship between frequency bandwidth and S/N ratio for each received power level. The horizontal axis of the graph represents the frequency bandwidth, and the vertical axis represents the S/N ratio. The graph plots the relationship between frequency bandwidth and S/N ratio when the received power Pr is 0.1 μW (equivalent to −40 dBm), 1 μW (equivalent to −30 dBm), and 10 μW (equivalent to −20 dBm). As shown in the graph, the S/N ratio decreases as the frequency bandwidth increases, regardless of the magnitude of Pr.

The graph includes auxiliary lines indicating the required S/N ratios for each modulation scheme—QPSK (Quadrature Phase Shift Keying), 16QAM (16 Quadrature Amplitude Modulation), and 64QAM (64 Quadrature Amplitude Modulation)—to achieve a BER (Bit Error Rate) of less than $10^{-3}$. According to this, at a frequency bandwidth of 25 GHz, communication is possible with any of the modulation schemes (QPSK, 16QAM, or 64QAM) if Pr is 0.1 μW or higher. However, at a frequency bandwidth of 50 GHz, the S/N ratio becomes too low for Pr of 0.1 μW, making communication with QPSK difficult. Furthermore, to achieve stable QPSK communication at even higher frequency bandwidths of around 100 GHz, a received power of 1 μW or higher is required.

The sixth-generation mobile communication system (6G) aims to achieve data rates of 100 Gbps or higher using even higher frequency bands of 300 GHz compared to the fifth-generation mobile communication system (5G). Therefore, in next-generation mobile communication systems, which will increasingly utilize higher frequencies and higher data rates, it will be necessary to increase the output power of transmitters to maintain large received power. Up until now, approaches to increase the output power of transceivers operating in the 300 GHz band have included using lenses or horns to enhance antenna gain, or employing rat-race power couplers to power-couple a plurality of RF signals and thereby increase the output power of a single transceiver (see, for example, Patent Literature 1).

CITATION LIST

Patent Literature

Patent Literature 1: WO 2020/110814 A1

SUMMARY OF THE INVENTION

Technical Problem

From the perspective of Equivalent Isotropic Radiation Power (EIRP), the received power can be evaluated as follows: given the distance d between the transmitter and the receiver, and the antenna area Ar of the receiver, the received power Pr can be expressed as $Pr=EIPR \cdot Ar/4\pi d^2$. In other words, the received power is determined by the antenna area Ar of the receiver, irrespective of the frequency bandwidth. The larger the antenna area, the greater the antenna gain, and thus, the greater the received power.

To increase antenna gain, it is effective to adopt an array antenna in which a plurality of antenna elements is arranged. Furthermore, by adopting a phased array antenna, beamforming technology and beam sweeping become available. Beamforming allows for transmitting radio waves in a specific direction or receiving radio waves from a specific direction by adjusting the signal phase of each antenna element, while beam sweeping enables freely changing the beam direction. This approach not only broadens the beam control angle compared to using lenses or horns but also makes beamforming itself easier.

In an array antenna, the antenna elements are arranged at a pitch of half the wavelength of the radio waves. When it comes to the 300 GHz band, it is necessary to arrange the antenna elements at a pitch of approximately 500 μm. Therefore, if one attempts to adopt an array antenna with antenna elements arranged in a two-dimensional grid for a transceiver using the 300 GHz band, the transceiver circuit must be placed in an area of about 500 μm square. Although the miniaturization of semiconductor processes can reduce the size of transistors, passive elements such as inductance elements and capacitance elements are difficult to miniaturize. Consequently, it is challenging to place circuits disclosed in Patent Literature 1 in such a narrow area. Thus, adopting an array antenna for a transceiver using the 300 GHz band is difficult due to the constraints of circuit placement area.

In view of the above problem, it is an object of the present invention to provide an array antenna device capable of utilizing the 300 GHz band.

Solution to the Problem

An array antenna device according to one aspect of the present invention includes a first layer in which a plurality of antenna elements is arranged in a grid pattern, and a second layer stacked on the first layer. The second layer includes a plurality of mixers, each having an LO signal terminal, an IF signal terminal, and an RF signal terminal, with the RF signal terminals being electrically connected to the plurality of antenna elements. The plurality of mixers is arranged in a plurality of grid areas that overlap with the plurality of antenna elements in a plan view. Additionally, the second layer includes a plurality of LO signal lines provided for each column of the plurality of mixers, wherein the LO signal terminals of the mixers in the same column are commonly connected, and a plurality of IF signal lines provided for each row of the plurality of mixers, wherein the IF signal terminals of the mixers in the same row are commonly connected.

Advantageous Effects of the Invention

According to the present invention, it is possible to transmit and receive 300 GHz band radio waves with an array antenna. This enables the antenna gain to be easily increased in the 300 GHz band.

DETAILED DESCRIPTION OF THE INVENTION

Figure 1:
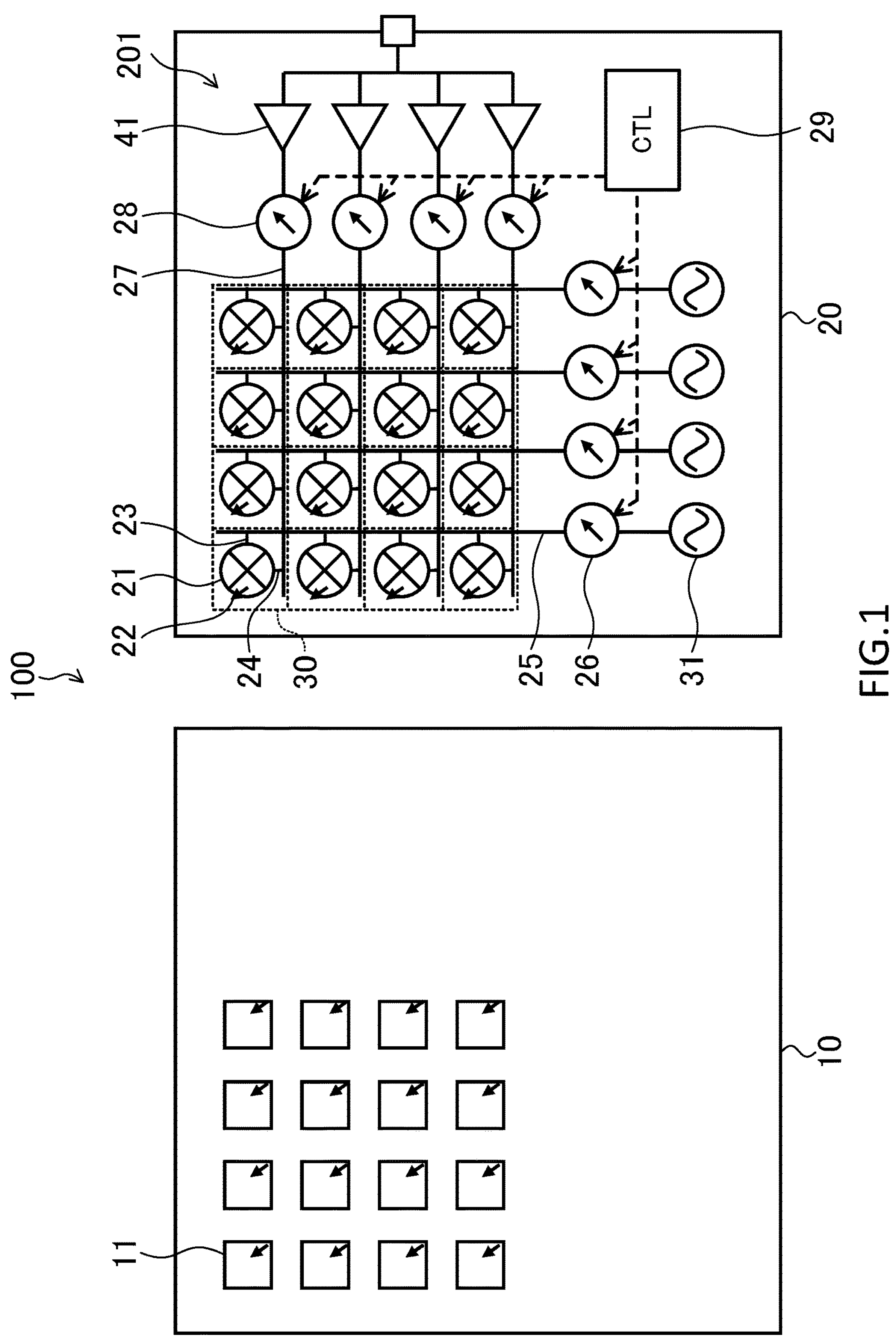
FIG. 1 is a plan view schematic diagram of an array antenna device according to the first embodiment of the present invention.

Hereinafter, the embodiments will be described in detail with reference to the drawings as appropriate. However, overly detailed explanations may be omitted. For example, detailed descriptions of well-known matters and redundant explanations of substantially identical configurations may be omitted. This is to avoid unnecessary redundancy in the following description and to facilitate understanding by those skilled in the art. The inventors provide the accompanying drawings and the following description for the purpose of enabling those skilled in the art to fully understand the present invention, and do not intend to limit the subject matter described in the claims. Additionally, the dimensions and detailed shapes of the parts depicted in the drawings may differ from the actual ones.

First Embodiment

FIG. 1 is a plan view schematic diagram of an array antenna device according to the first embodiment of the present invention. The array antenna device 100 according to this embodiment is a 300 GHz band silicon CMOS transmitter in which a printed circuit board 10 and a semiconductor substrate 20 are stacked. For convenience, in FIG. 1, the plan views of the printed circuit board 10 and the semiconductor substrate 20 are depicted side by side, but in reality, they are stacked by flip-chip bonding.

Antenna elements 11, such as rectangular microstrip patch antennas, are arranged in a 4×4 grid pattern on the printed circuit board 10. Considering that the desired RF frequency of the array antenna device 100 is 252-296 GHz (wavelength approximately 1000-1200 μm), as an example, the sum of the lengths of the two sides of each antenna element 11 is 300-350 μm, which provides a slight margin over one-quarter wavelength of the RF signal. The arrangement pitch of the antenna elements 11 in the row and column directions (corresponding to the horizontal and vertical directions in FIG. 1) is 600-700 μm, which provides a slight margin over one-half wavelength of the RF signal.

A transmission circuit 201 is formed on the semiconductor substrate 20. The transmission circuit 201 is an assembly of individual transmitters that transmit RF signals (radio frequency signals) from each antenna element 11. These individual transmitters have a mixer-last configuration, where a mixer, which upconverts an IF signal (intermediate frequency signal) to an RF signal using an LO signal (local oscillator frequency signal), is positioned at the final stage. This mixer-last configuration is adopted in 300 GHz band silicon CMOS transmitters where it is not feasible to place a power amplifier at the final stage.

Figure 2:
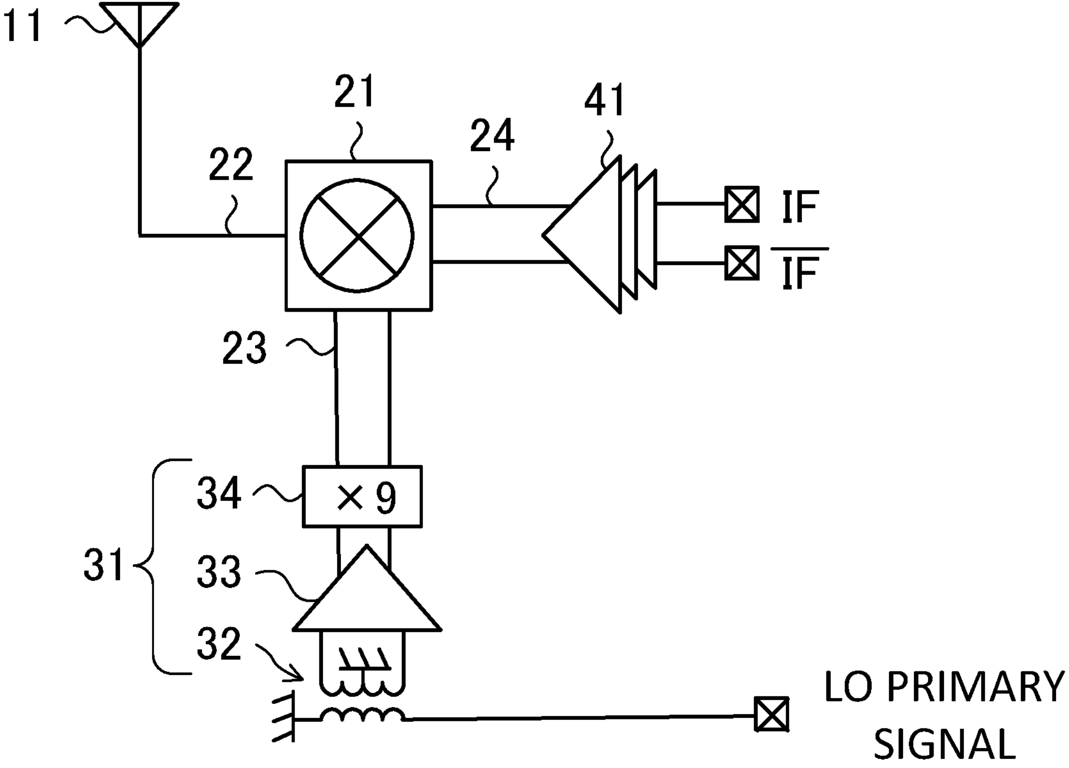
FIG. 2 is a circuit diagram of a mixer-last configuration transmitter according to an example.

FIG. 2 is a circuit diagram of a mixer-last configuration transmitter according to an example. This transmitter includes a mixer 21, an LO signal generator 31, and an IF signal amplifier 41. The RF signal terminal 22 of the mixer 21 is connected to the antenna element 11, the LO signal terminal 23 is connected to the LO signal generator 31, and the IF signal terminal 24 is connected to the IF signal amplifier 41.

More specifically, the LO signal generator 31 includes a balun 32, a preamplifier 33, and a 9-times multiplier 34. The balun 32 converts an unbalanced LO primary signal supplied from an oscillator (not shown) into a balanced signal. As an example, the frequency of the LO primary signal is 25 GHz. The preamplifier 33 amplifies the balanced signal output from the balun 32. The 9-times multiplier 34 multiplies the frequency of the output signal of the preamplifier 33 by nine and outputs a 225 GHz LO signal. The output signal of the 9-times multiplier 34 is input to the mixer 21 via the LO signal terminal 23 of the mixer 21. The IF signal amplifier 41 includes a plurality of amplifiers connected in series and amplifies a balanced IF signal of approximately 50 GHz that is input from the outside. The output signal of the IF signal amplifier 41 is input to the mixer 21 via the IF signal terminal 24 of the mixer 21. An RF signal of 275 GHz is generated at the RF signal terminal 22 of the mixer 21.

Note that the frequency of the LO primary signal may be set to 75 GHz, and the 9-times multiplier 34 may be replaced with a tripler that triples the frequency of the input signal.

Returning to FIG. 1, on the semiconductor substrate 20, the mixers 21 of the individual transmitters are arranged in a grid pattern within the 4×4 grid areas 30. Each mixer 21 includes one or more transistors and one or more passive elements. Each side of the grid areas 30 has a length of 600-700 μm, which is the same as the arrangement pitch of the antenna elements 11, and each grid area 30 accommodates one antenna element 11 in plan view. Thus, with the printed circuit board 10 as the upper layer and the semiconductor substrate 20 as the lower layer, each mixer 21 is positioned directly below each antenna element 11 in plan view. The RF signal terminals 22 of the mixers 21 on the semiconductor substrate 20 are electrically connected to the corresponding antenna elements 11 on the printed circuit board 10 via bumps (not shown).

LO signal lines 25 are wired for each column of the mixers 21 arranged in a grid pattern. In this embodiment, there are four LO signal lines 25 in total. These LO signal lines 25 run vertically through a plurality of grid areas 30 along the arrangement of the mixer 21 columns at equal intervals, which is the same pitch as the arrangement pitch of the antenna elements 11. The LO signal terminals 23 of the four mixers 21 in the same column are commonly connected to each LO signal line 25.

LO phase shifters 26 are connected to the ends of each LO signal line 25. Furthermore, the LO signal generator 31 is connected to each LO phase shifter 26. Each LO phase shifter 26 receives the LO signal from the LO signal generator 31, adjusts its phase, and supplies the phase-adjusted LO signal to each LO signal line 25. The amount of phase adjustment by each LO phase shifter 26 is controlled by a controller 29. In this manner, the LO signal with the same phase is input to the mixers 21 in the same column, and the phase of the LO signal can be adjusted independently for each column of mixers 21. This allows for beam sweeping in the row direction of the antenna elements 11 array by adjusting the phase of the LO signal in each LO signal line 25.

IF signal lines 27 are wired for each row of the mixers 21 arranged in a grid pattern. In this embodiment, there are four IF signal lines 27 in total. These IF signal lines 27 run horizontally through a plurality of grid areas 30 along the arrangement of the mixer 21 rows at equal intervals, which is the same pitch as the arrangement pitch of the antenna elements 11. The IF signal terminals 24 of the four mixers 21 in the same row are commonly connected to each IF signal line 27.

IF phase shifters 28 are connected to the ends of each IF signal line 27. Furthermore, the IF signal amplifier 41 is connected to each IF phase shifter 28. Each IF phase shifter 28 receives the IF signal amplified by the IF signal amplifier 41, adjusts its phase, and supplies the phase-adjusted IF signal to each IF signal line 27. The amount of phase adjustment by each IF phase shifter 28 is controlled by the controller 29. In this manner, the IF signal with the same phase is input to the mixers 21 in the same row, and the phase of the IF signal can be adjusted independently for each row of mixers 21. This allows for beam sweeping in the column direction of the antenna elements 11 array by adjusting the phase of the IF signal in each IF signal line 27.

As mentioned above, each grid area 30 is a narrow region with a side length of 600-700 μm, which cannot accommodate many circuit elements. Therefore, circuits that require a certain size, such as the LO phase shifters 26, the LO signal generators 31, the IF phase shifters 28, the IF signal amplifiers 41, and the controller 29, are all placed outside the grid areas 30. For example, as shown in FIG. 1, the LO phase shifters 26, which are connected to the ends of the LO signal lines 25 extending in the column direction of the grid areas 30, and the LO signal generators 31 connected to them are placed in the available space in the column direction of the grid areas 30. Similarly, the IF phase shifters 28, which are connected to the ends of the IF signal lines 27 extending in the row direction of the grid areas 30, and the IF signal amplifiers 41 connected to them are placed in the available space in the row direction of the grid areas 30. The controller 29 can be placed in the remaining available space.

As described above, according to this embodiment, it is possible to increase the transmission power by adopting an array antenna in a 300 GHz silicon CMOS transmitter. Furthermore, by adjusting the phases of the LO signal and the IF signal, the transmitted RF signal can be swept in both vertical and horizontal two-dimensional directions. Additionally, by placing the mixers 21, LO phase shifters 26, LO signal generators 31, IF phase shifters 28, IF signal amplifiers 41, and the controller 29 on the same layer of the semiconductor substrate 20, it becomes easier to dissipate heat compared to stacking these components. This configuration prevents the heat generated by various circuit elements from being trapped, thereby preventing performance degradation of the transmission circuit 201 due to heat generation from the semiconductor substrate 20.

In the example of FIG. 1, the LO signal generator 31 is provided one-to-one with each LO phase shifter 26, but it is also possible to distribute and supply the LO signal from a single LO signal generator 31 to a plurality of LO phase shifters 26. Similarly, in the example of FIG. 1, the IF signal amplifier 41 is provided one-to-one with each IF phase shifter 28, but it is also possible to distribute and supply the IF signal from a single IF signal amplifier 41 to a plurality of IF phase shifters 28. Furthermore, the connection order of the IF phase shifters 28 and the IF signal amplifiers 41 can be reversed, so that the IF signals phase-adjusted by the IF phase shifters 28 are amplified by the IF signal amplifiers 41 and then supplied to the IF signal lines 27. In other words, the IF phase shifters 28 may be directly connected to the IF signal lines 27 or connected via the IF signal amplifiers 41.

The extent to which circuits can be placed in the grid area 30 depends on the size of the standard cell, which is determined by the arrangement pitch of the antenna elements 11. If there is still room in the grid area 30, other than the mixer 21, components such as the 9-times multiplier 34 of the LO signal generator 31 (or a tripler or other multipliers if applicable), the final stage amplifier of the IF signal amplifier 41, and buffer circuits (not shown) connected to the mixer 21 can be placed within the grid area 30. By placing as many circuit elements connected to the mixer 21 as close to the mixer 21 as possible, the wiring distance from these circuit elements to the mixer 21 can be minimized, thereby suppressing signal attenuation input to the mixer 21 and improving the noise figure of the transmitter.

Second Embodiment

Figure 3:
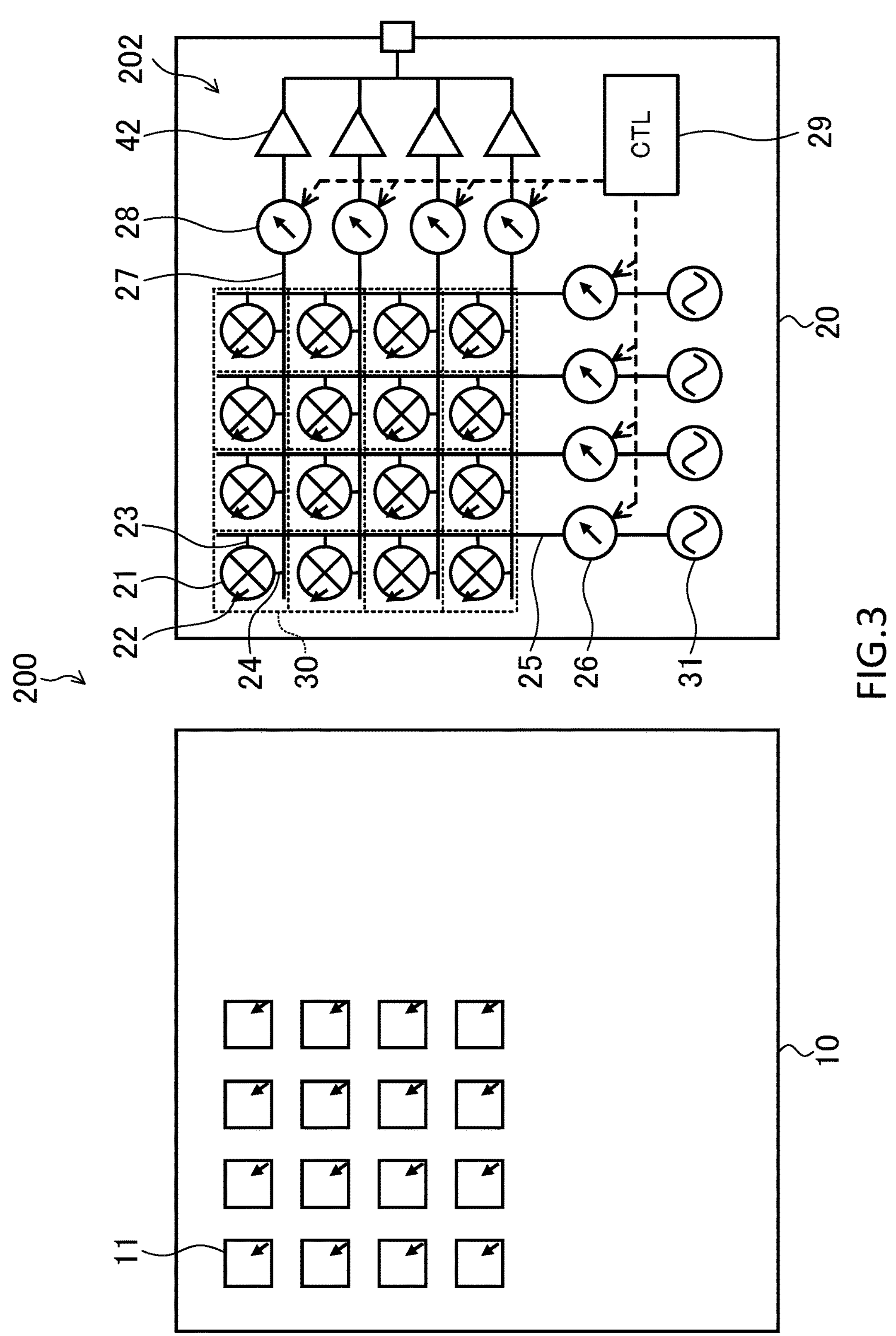
FIG. 3 is a plan view schematic diagram of an array antenna device according to the second embodiment of the present invention.

FIG. 3 is a plan view schematic diagram of an array antenna device according to the second embodiment of the present invention. The array antenna device 200 according to this embodiment is a 300 GHz band silicon CMOS receiver in which a printed circuit board 10 and a semiconductor substrate 20 are stacked. For convenience, in FIG. 3, the plan views of the printed circuit board 10 and the semiconductor substrate 20 are depicted side by side, but in reality, they are stacked by flip-chip bonding.

Antenna elements 11, such as rectangular microstrip patch antennas, are arranged in a 4×4 grid pattern on the printed circuit board 10. Considering that the desired RF frequency of the array antenna device 200 is 252-296 GHz (wavelength approximately 1000-1200 μm), as an example, the sum of the lengths of the two sides of each antenna element 11 is 300-350 μm, which provides a slight margin over one-quarter wavelength of the RF signal. The arrangement pitch of the antenna elements 11 in the row and column directions (corresponding to the horizontal and vertical directions in FIG. 3) is 600-700 μm, which provides a slight margin over one-half wavelength of the RF signal.

A receiver circuit 202 is formed on the semiconductor substrate 20. The receiver circuit 202 is an assembly of individual receivers that process the RF signals received by each antenna element 11. These individual receivers have a mixer-first configuration, where a mixer, which downconverts the RF signal to an IF signal using an LO signal, is positioned at the first stage. This mixer-first configuration is adopted in 300 GHz band silicon CMOS receivers where it is not feasible to place a low-noise amplifier at the first stage.

Figure 4:
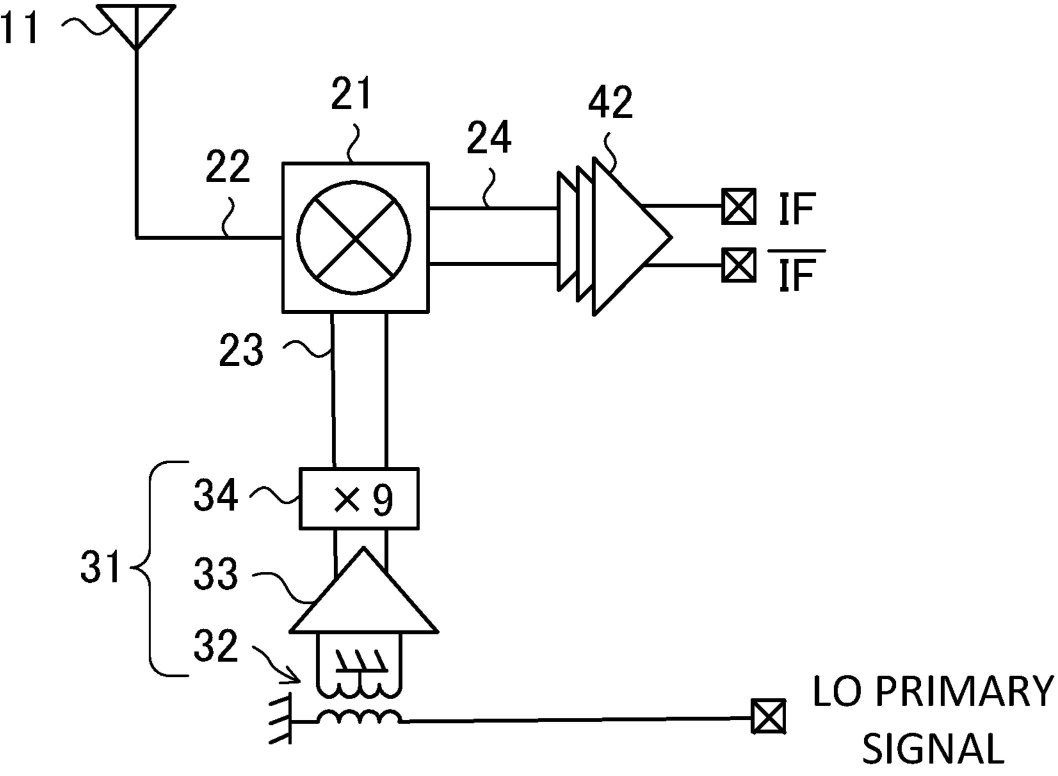
FIG. 4 is a circuit diagram of a mixer-first configuration receiver according to an example.

FIG. 4 is a circuit diagram of a mixer-first configuration receiver according to an example. This receiver includes a mixer 21, an LO signal generator 31, and an IF signal amplifier 42. The RF signal terminal 22 of the mixer 21 is connected to the antenna element 11, the LO signal terminal 23 is connected to the LO signal generator 31, and the IF signal terminal 24 is connected to the IF signal amplifier 42.

More specifically, the LO signal generator 31 includes a balun 32, a preamplifier 33, and a 9-times multiplier 34. The balun 32 converts an unbalanced LO primary signal supplied from an oscillator (not shown) into a balanced signal. As an example, the frequency of the RF signal at the RF signal terminal 22 of the mixer 21 is 275 GHz, and the frequency of the LO primary signal is 25 GHz. The preamplifier 33 amplifies the balanced signal output from the balun 32. The 9-times multiplier 34 multiplies the frequency of the output signal of the preamplifier 33 by nine and outputs a 225 GHz LO signal. The output signal of the 9-times multiplier 34 is input to the mixer 21 via the LO signal terminal 23 of the mixer 21. The IF signal amplifier 42 includes a plurality of amplifiers connected in series and amplifies the balanced IF signal of approximately 50 GHz output from the IF signal terminal 24 of the mixer 21.

Note that the frequency of the LO primary signal may be set to 75 GHz, and the 9-times multiplier 34 may be replaced with a tripler that triples the frequency of the input signal.

Returning to FIG. 3, on the semiconductor substrate 20, the mixers 21 of the aforementioned individual receivers are arranged in a grid pattern within the 4×4 grid areas 30. Each mixer 21 includes one or more transistors and one or more passive elements. Each side of the grid areas 30 has a length of 600-700 μm, which is the same as the arrangement pitch of the antenna elements 11, and each grid area 30 accommodates one antenna element 11 in plan view. Thus, with the printed circuit board 10 as the upper layer and the semiconductor substrate 20 as the lower layer, each mixer 21 is positioned directly below each antenna element 11 in plan view. The RF signal terminals 22 of the mixers 21 on the semiconductor substrate 20 are electrically connected to the corresponding antenna elements 11 on the printed circuit board 10 via bumps (not shown).

LO signal lines 25 are wired for each column of the mixers 21 arranged in a grid pattern. In this embodiment, there are four LO signal lines 25 in total. These LO signal lines 25 run vertically through a plurality of grid areas 30 along the arrangement of the mixer 21 columns at equal intervals, which is the same pitch as the arrangement pitch of the antenna elements 11. The LO signal terminals 23 of the four mixers 21 in the same column are commonly connected to each LO signal line 25.

LO phase shifters 26 are connected to the ends of each LO signal line 25. Furthermore, the LO signal generator 31 is connected to each LO phase shifter 26. Each LO phase shifter 26 receives the LO signal from the LO signal generator 31, adjusts its phase, and supplies the phase-adjusted LO signal to each LO signal line 25. The amount of phase adjustment by each LO phase shifter 26 is controlled by the controller 29. In this manner, the LO signal with the same phase is input to the mixers 21 in the same column, and the phase of the LO signal can be adjusted independently for each column of mixers 21. This allows for beam sweeping in the row direction of the array of antenna elements 11 by adjusting the phase of the LO signal in each LO signal line 25.

IF signal lines 27 are wired for each row of the mixers 21 arranged in a grid pattern. In this embodiment, there are four IF signal lines 27 in total. These IF signal lines 27 run horizontally through a plurality of grid areas 30 along the arrangement of the mixer 21 rows at equal intervals, which is the same pitch as the arrangement pitch of the antenna elements 11. The IF signal terminals 24 of the four mixers 21 in the same row are commonly connected to each IF signal line 27.

IF phase shifters 28 are connected to the ends of each IF signal line 27. Furthermore, the IF signal amplifier 42 is connected to each IF phase shifter 28. The IF phase shifters 28 and the IF signal amplifiers 42 connected to them are placed in the available space in the row direction of the grid areas 30. Each IF phase shifter 28 receives the IF signal from the IF signal line 27 and adjusts its phase. The IF signal amplifier 42 amplifies the IF signal phase-adjusted by the IF phase shifter 28. The IF signals of each phase are power-coupled after being amplified by the IF signal amplifiers 42 to become the received IF signal. The amount of phase adjustment by each IF phase shifter 28 is controlled by the controller 29. In this manner, the IF signal with the same phase is output from the mixers 21 in the same row, and the phase of the IF signal can be adjusted independently for each row of mixers 21. This allows for beam sweeping in the column direction of the array of antenna elements 11 by adjusting the phase of the IF signal in each IF signal line 27.

As mentioned above, each grid area 30 is a narrow region with a side length of 600-700 μm, which cannot accommodate many circuit elements. Therefore, circuits that require a certain size, such as the LO phase shifters 26, the LO signal generators 31, the IF phase shifters 28, the IF signal amplifiers 42, and the controller 29, are all placed outside the grid areas 30. For example, as shown in FIG. 3, the LO phase shifters 26, which are connected to the ends of the LO signal lines 25 extending in the column direction of the grid areas 30, and the LO signal generators 31 connected to them are placed in the available space in the column direction of the grid areas 30. Similarly, the IF phase shifters 28, which are connected to the ends of the IF signal lines 27 extending in the row direction of the grid areas 30, and the IF signal amplifiers 42 connected to them are placed in the available space in the row direction of the grid areas 30. The controller 29 can be placed in the remaining available space.

As described above, according to this embodiment, it is possible to increase the received power by adopting an array antenna in a 300 GHz silicon CMOS receiver. Furthermore, by adjusting the phases of the LO signal and the IF signal, the received RF signal can be swept in both vertical and horizontal two-dimensional directions. Additionally, by placing the mixers 21, LO phase shifters 26, LO signal generators 31, IF phase shifters 28, IF signal amplifiers 42, and the controller 29 on the same layer of the semiconductor substrate 20, it becomes easier to dissipate heat compared to stacking these components. This configuration prevents the heat generated by various circuit elements from being trapped, thereby preventing performance degradation of the receiver circuit 202 due to heat generation from the semiconductor substrate 20.

In the example of FIG. 3, the LO signal generator 31 is provided one-to-one with each LO phase shifter 26, but it is also possible to distribute and supply the LO signal from a single LO signal generator 31 to a plurality of LO phase shifters 26. Additionally, in the example of FIG. 3, the IF signal amplifier 42 is provided one-to-one with each IF phase shifter 28, but it is also possible to power-couple the output signals of a plurality of IF phase shifters 28 and then input the power-coupled IF signal to a single IF signal amplifier 42. Furthermore, the connection order of the IF phase shifters 28 and the IF signal amplifiers 42 can be reversed, so that the IF signals from the IF signal lines 27 are amplified by the IF signal amplifiers 42 and then phase-adjusted by the IF phase shifters 28. In other words, the IF phase shifters 28 may be directly connected to the IF signal lines 27 or connected via the IF signal amplifiers 42.

The extent to which circuits can be placed in the grid area 30 depends on the size of the standard cell, which is determined by the arrangement pitch of the antenna elements 11. If there is still room in the grid area 30, other than the mixer 21, components such as the 9-times multiplier 34 of the LO signal generator 31 (or a tripler or other multipliers if applicable), the first stage amplifier of the IF signal amplifier 42, and buffer circuits (not shown) connected to the mixer 21 can be placed within the grid area 30. By placing as many circuit elements that directly supply signals to or receive signals from the mixer 21 as close to the mixer 21 as possible, the wiring distance from these circuit elements to the mixer 21 can be minimized, thereby suppressing the attenuation of signals input to or output from the mixer 21 and improving the noise figure of the receiver.

Third Embodiment

Figure 5:
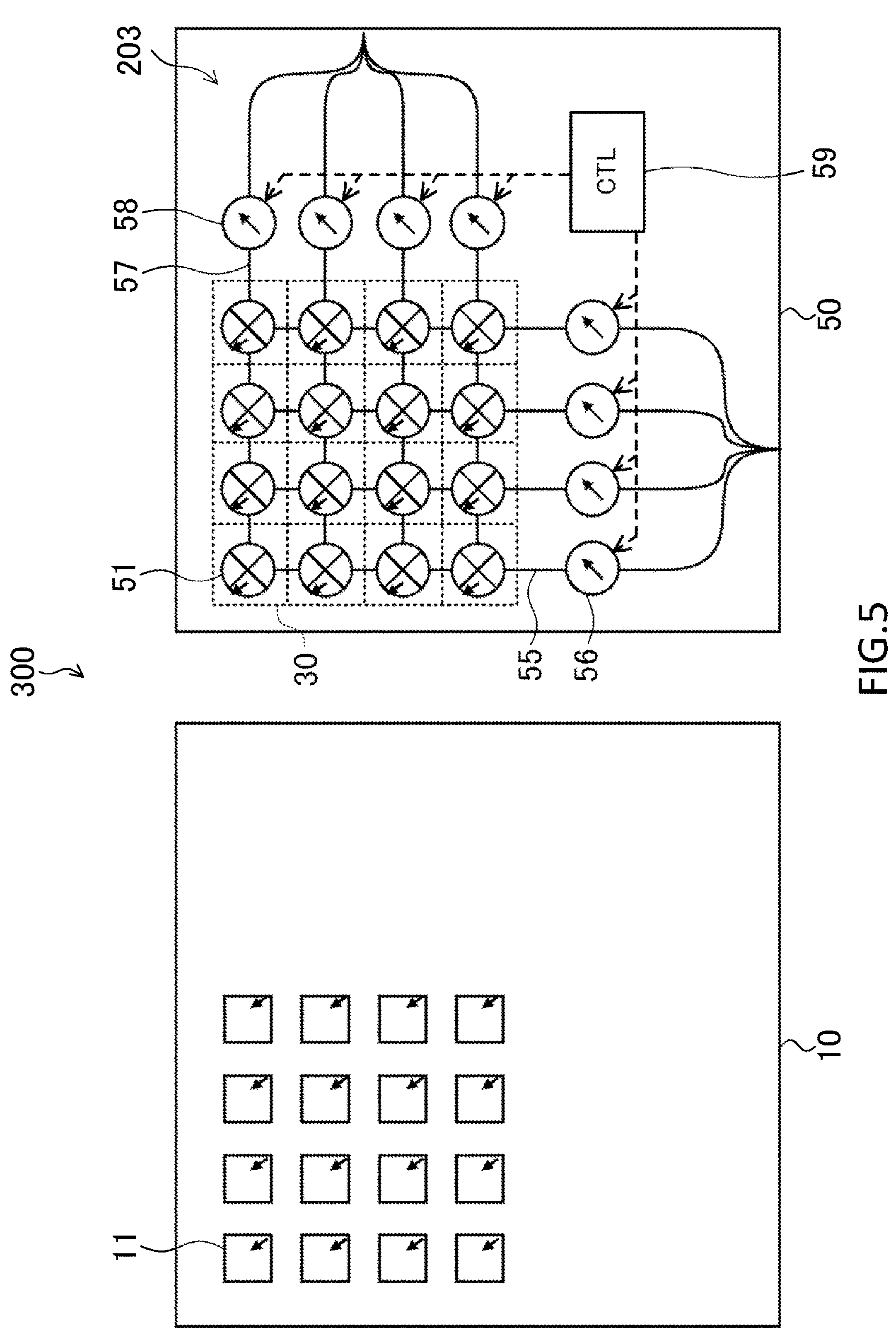
FIG. 5 is a plan view schematic diagram of an array antenna device according to the third embodiment of the present invention.

FIG. 5 is a plan view schematic diagram of an array antenna device according to the third embodiment of the present invention. The array antenna device 300 according to this embodiment is a 300 GHz band transmitter in which a printed circuit board 10 and a photonic-electronic substrate 50 are stacked. For convenience, in FIG. 5, the plan views of the printed circuit board 10 and the photonic-electronic substrate 50 are depicted side by side, but in reality, they are stacked by flip-chip bonding. The same points as in the first embodiment will be omitted, and only the differences will be described.

Antenna elements 11, such as rectangular microstrip patch antennas, are arranged in a 4×4 grid pattern on the printed circuit board 10. Considering that the desired RF frequency of the array antenna device 300 is 252-296 GHz (wavelength approximately 1000-1200 μm), as an example, the sum of the lengths of the two sides of each antenna element 11 is 300-350 μm, which provides a slight margin over one-quarter wavelength of the RF signal. The arrangement pitch of the antenna elements 11 in the row and column directions (corresponding to the horizontal and vertical directions in FIG. 5) is 600-700 μm, which provides a slight margin over one-half wavelength of the RF signal.

A photoelectric conversion circuit 203 is formed on the photonic-electronic substrate 50. Specifically, in the photonic-electronic substrate 50, mixers 51 are arranged in a grid pattern within the 4×4 grid areas 30. Each mixer 51 is an Uni-Traveling Carrier Photodiode (UTC-PD). When two optical signals with a frequency difference are input into a UTC-PD, a terahertz wave is generated as a beat signal of those optical signals. For example, by inputting two optical signals with a frequency difference of approximately 300 GHz (referred to as the LO signal and the IF signal, discussed later) into the mixer 51, a 300 GHz band electromagnetic wave is generated in the mixer 51, and a 300 GHz radio wave is output from the antenna element 11.

Each side of the grid areas 30 has a length of 600-700 μm, which is the same as the arrangement pitch of the antenna elements 11, and each grid area 30 accommodates one antenna element 11 in plan view. Thus, with the printed circuit board 10 as the upper layer and the photonic-electronic substrate 50 as the lower layer, each mixer 51 is positioned directly below each antenna element 11 in plan view. The RF signal terminals (not shown) of the mixers 51 on the photonic-electronic substrate 50 are electrically connected to the corresponding antenna elements 11 on the printed circuit board 10 via bumps (not shown).

LO signal lines 55 are wired for each column of the mixers 51 arranged in a grid pattern. The LO signal lines 55 are optical waveguides, and there are four of them in this embodiment. These LO signal lines 55 run vertically through a plurality of grid areas 30 along the arrangement of the mixer 51 columns at equal intervals, which is the same pitch as the arrangement pitch of the antenna elements 11. The LO signal terminals (not shown) of the four mixers 51 in the same column are commonly connected to each LO signal line 55.

LO phase shifters 56 are connected to the ends of each LO signal line 55. The LO phase shifters 56 are optical phase shifters that adjust the phase of the input optical signal. Each LO phase shifter 56 receives the LO signal, which is an optical signal, adjusts its phase, and supplies the phase-adjusted LO signal to each LO signal line 55. As an example, the LO signal is near-infrared light with a wavelength of approximately 1.5 μm. The amount of phase adjustment by each LO phase shifter 56 is controlled by a controller 59. In this manner, the LO signal with the same phase is input to the mixers 51 in the same column, and the phase of the LO signal can be adjusted independently for each column of mixers 51. This allows for beam sweeping in the row direction of the array of antenna elements 11 by adjusting the phase of the LO signal in each LO signal line 55.

IF signal lines 57 are wired for each row of the mixers 51 arranged in a grid pattern. The IF signal lines 57 are optical waveguides, and there are four of them in this embodiment. These IF signal lines 57 run horizontally through a plurality of grid areas 30 along the arrangement of the mixer 51 rows at equal intervals, which is the same pitch as the arrangement pitch of the antenna elements 11. The IF signal terminals (not shown) of the four mixers 51 in the same row are commonly connected to each IF signal line 57.

IF phase shifters 58 are connected to the ends of each IF signal line 57. The IF phase shifters 58 are optical phase shifters that adjust the phase of the input optical signal. Each IF phase shifter 58 receives the IF signal, which is an optical signal, adjusts its phase, and supplies the phase-adjusted IF signal to each IF signal line 57. As an example, the IF signal is near-infrared light with a wavelength of approximately 1.5 μm, and the frequency difference with the LO signal is about 300 GHz. The amount of phase adjustment by each IF phase shifter 58 is controlled by the controller 59. In this manner, the IF signal with the same phase is input to the mixers 51 in the same row, and the phase of the IF signal can be adjusted independently for each row of mixers 51. This allows for beam sweeping in the column direction of the array of antenna elements 11 by adjusting the phase of the IF signal in each IF signal line 57.

As mentioned above, each grid area 30 is a narrow region with a side length of 600-700 μm, which cannot accommodate many circuit elements. Therefore, the LO phase shifters 56, IF phase shifters 58, and the controller 59 are all placed outside the grid areas 30. For example, as shown in FIG. 5, the LO phase shifters 56, which are connected to the ends of the LO signal lines 55 extending in the column direction of the grid areas 30, are placed in the available space in the column direction of the grid areas 30. Similarly, the IF phase shifters 58, which are connected to the ends of the IF signal lines 57 extending in the row direction of the grid areas 30, are placed in the available space in the row direction of the grid areas 30. The controller 59 can be placed in the remaining available space.

As described above, according to this embodiment, it is possible to increase the transmission power by adopting an array antenna in a 300 GHz band transmitter as a wireless interface for optical communication devices. Furthermore, by adjusting the phases of the LO signal and the IF signal, the transmitted RF signal can be swept in both vertical and horizontal two-dimensional directions.

Fourth Embodiment

Figure 6:
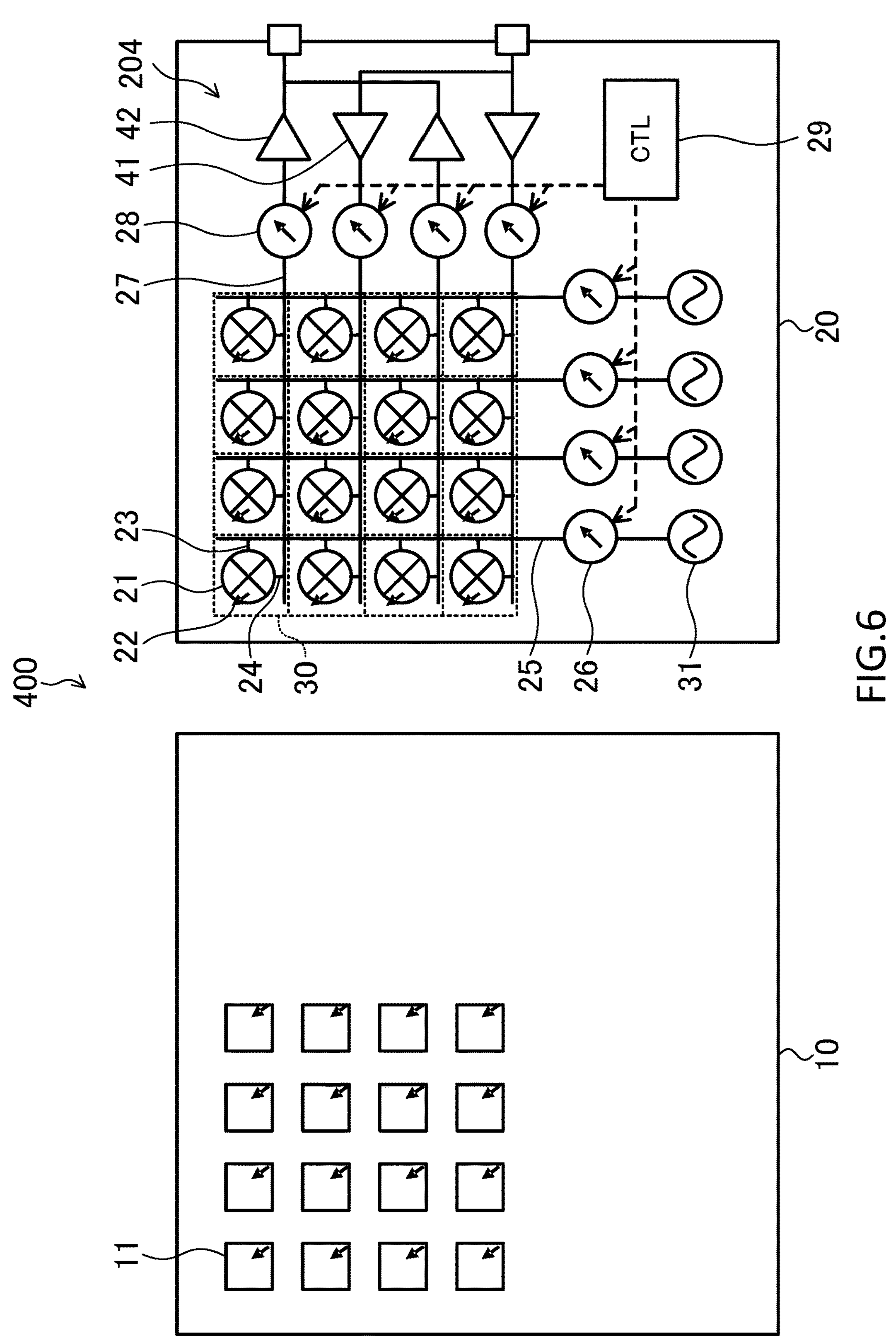
FIG. 6 is a plan view schematic diagram of an array antenna device according to the fourth embodiment of the present invention.

It is also possible to integrate the transmitter according to the first embodiment and the receiver according to the second embodiment. FIG. 6 is a plan view schematic diagram of an array antenna device according to the fourth embodiment of the present invention. The array antenna device 400 according to this embodiment is a 300 GHz band silicon CMOS transceiver in which a printed circuit board 10 and a semiconductor substrate 20 are stacked. For convenience, in FIG. 6, the plan views of the printed circuit board 10 and the semiconductor substrate 20 are depicted side by side, but in reality, they are stacked by flip-chip bonding.

Antenna elements 11, such as rectangular microstrip patch antennas, are arranged in a 4×4 grid pattern on the printed circuit board 10. Considering that the desired RF frequency of the array antenna device 400 is 252-296 GHz (wavelength approximately 1000-1200 μm), as an example, the sum of the lengths of the two sides of each antenna element 11 is 300-350 μm, which provides a slight margin over one-quarter wavelength of the RF signal. The arrangement pitch of the antenna elements 11 in the row direction (horizontal direction in FIG. 6) is 600-700 μm, which provides a slight margin over one-half wavelength of the RF signal, and the arrangement pitch in the column direction (vertical direction in FIG. 6) is 300-350 μm, which provides a slight margin over one-quarter wavelength of the RF signal. In other words, the arrangement pitch of the antenna elements 11 in the column direction is half that of the first and second embodiments.

A transceiver circuit 204 is formed on the semiconductor substrate 20. The transceiver circuit 204 is an assembly of individual mixer-last configuration transmitters that transmit RF signals (radio frequency signals) from each antenna element 11 and individual mixer-first configuration receivers that process the RF signals received by each antenna element 11. The mixer-last configuration transmitters and mixer-first configuration receivers are as described with reference to FIGS. 2 and 4.

On the semiconductor substrate 20, the mixers 21 of the aforementioned individual transmitters and receivers are arranged in a grid pattern within the 4×4 grid areas 30. Each mixer 21 includes one or more transistors and one or more passive elements. The lengths of the vertical and horizontal sides of each grid area 30 are 300-350 μm and 600-700 μm, respectively, which are the same as the arrangement pitch of the antenna elements 11 in the column and row directions. Each grid area 30 accommodates one antenna element 11 in plan view. Thus, with the printed circuit board 10 as the upper layer and the semiconductor substrate 20 as the lower layer, each mixer 21 is positioned directly below each antenna element 11 in plan view. The RF signal terminals 22 of the mixers 21 on the semiconductor substrate 20 are electrically connected to the corresponding antenna elements 11 on the printed circuit board 10 via bumps (not shown).

LO signal lines 25 are wired for each column of the mixers 21 arranged in a grid pattern. In this embodiment, there are four LO signal lines 25 in total. These LO signal lines 25 run vertically through a plurality of grid areas 30 along the arrangement of the mixer 21 columns at equal intervals, which is the same pitch as the arrangement pitch of the antenna elements 11 in the raw direction. The LO signal terminals 23 of the four mixers 21 in the same column are commonly connected to each LO signal line 25.

LO phase shifters 26 are connected to the ends of each LO signal line 25. Furthermore, the LO signal generator 31 is connected to each LO phase shifter 26. Each LO phase shifter 26 receives the LO signal from the LO signal generator 31, adjusts its phase, and supplies the phase-adjusted LO signal to each LO signal line 25. The amount of phase adjustment by each LO phase shifter 26 is controlled by the controller 29. In this manner, the LO signal with the same phase is input to the mixers 21 in the same column, and the phase of the LO signal can be adjusted independently for each column of mixers 21. This allows for beam sweeping in the row direction of the array of antenna elements 11 by adjusting the phase of the LO signal in each LO signal line 25.

IF signal lines 27 are wired for each row of the mixers 21 arranged in a grid pattern. In this embodiment, there are four IF signal lines 27 in total. These IF signal lines 27 run horizontally through a plurality of grid areas 30 along the arrangement of the mixer 21 rows at equal intervals, which is the same pitch as the arrangement pitch of the antenna elements 11 in the column direction. The IF signal terminals 24 of the four mixers 21 in the same row are commonly connected to each IF signal line 27.

IF phase shifters 28 are connected to the ends of each IF signal line 27. Furthermore, each IF phase shifter 28 is alternately connected to the aforementioned IF signal amplifiers 41 and 42. The IF phase shifters 28 and the IF signal amplifiers 41 and 42 connected to them are placed in the available space in the row direction of the grid areas 30. In other words, the circuit elements of the individual transmitters and receivers are alternately arranged in the column direction of the antenna elements 11 arranged in a grid pattern. Each IF phase shifter 28 of the transmitters receives the IF signal amplified by the IF signal amplifier 41, adjusts its phase, and supplies the phase-adjusted IF signal to each IF signal line 27. Each IF phase shifter 28 of the receivers receives the IF signal from the IF signal line 27 and adjusts its phase. The IF signal amplifiers 42 of the receivers amplify the IF signal phase-adjusted by the IF phase shifter 28, and the IF signals of each phase are power-coupled after being amplified by the IF signal amplifiers 42 to become the received IF signal. The amount of phase adjustment by each IF phase shifter 28 is controlled by the controller 29. In this manner, for the transmitters, the IF signal with the same phase is input to the mixers 21 in the same row, and for the receivers, the IF signal with the same phase is output from the mixers 21 in the same row. The phase of the IF signal can be adjusted independently for each row of mixers 21. This allows for beam sweeping in the column direction of the array of antenna elements 11 for both transmission and reception by adjusting the phase of the IF signal in each IF signal line 27.

As mentioned above, each grid area 30 is a narrow region with vertical sides of 300-350 μm and horizontal sides of 600-700 μm, which cannot accommodate many circuit elements. Therefore, circuits that require a certain size, such as the LO phase shifters 26, LO signal generators 31, IF phase shifters 28, IF signal amplifiers 41, IF signal amplifiers 42, and the controller 29, are all placed outside the grid areas 30. For example, as shown in FIG. 6, the LO phase shifters 26, which are connected to the ends of the LO signal lines 25 extending in the column direction of the grid areas 30, and the LO signal generators 31 connected to them are placed in the available space in the column direction of the grid areas 30. Similarly, the IF phase shifters 28, which are connected to the ends of the IF signal lines 27 extending in the row direction of the grid areas 30, and the IF signal amplifiers 41 and 42 connected to them are placed in the available space in the row direction of the grid areas 30. The controller 29 can be placed in the remaining available space.

As described above, according to this embodiment, it is possible to increase the transmission power and reception power by adopting an array antenna in a 300 GHz silicon CMOS transceiver. Furthermore, by adjusting the phases of the LO signal and the IF signal, the transmitted RF signal and the received RF signal can be swept in both vertical and horizontal two-dimensional directions. Additionally, by placing the mixers 21, LO phase shifters 26, LO signal generators 31, IF phase shifters 28, IF signal amplifiers 41, IF signal amplifiers 42, and the controller 29 on the same layer of the semiconductor substrate 20, it becomes easier to dissipate heat compared to stacking these components. This configuration prevents the heat generated by various circuit elements from being trapped, thereby preventing performance degradation of the transceiver circuit 204 due to heat generation from the semiconductor substrate 20.

In the example of FIG. 6, the LO signal generator 31 is provided one-to-one with each LO phase shifter 26, but it is also possible to distribute and supply the LO signal from a single LO signal generator 31 to a plurality of LO phase shifters 26. Additionally, in the example of FIG. 6, the IF signal amplifier 41 is provided one-to-one with each IF phase shifter 28, but it is also possible to distribute and supply the IF signal from a single IF signal amplifier 41 to a plurality of IF phase shifters 28. Furthermore, in the example of FIG. 6, the IF signal amplifier 42 is provided one-to-one with each IF phase shifter 28, but it is also possible to power-couple the output signals of a plurality of IF phase shifters 28 and then input the power-coupled IF signal to a single IF signal amplifier 42. Additionally, the connection order of the IF phase shifters 28 and the IF signal amplifiers 41 can be reversed, so that the IF signal phase-adjusted by the IF phase shifters 28 is amplified by the IF signal amplifiers 41 and then supplied to the IF signal lines 27. In other words, the IF phase shifters 28 of the transmitters may be directly connected to the IF signal lines 27 or connected via the IF signal amplifiers 41. Similarly, the connection order of the IF phase shifters 28 and the IF signal amplifiers 42 can be reversed, so that the IF signal from the IF signal lines 27 is amplified by the IF signal amplifiers 42 and then phase-adjusted by the IF phase shifters 28. In other words, the IF phase shifters 28 of the receivers may be directly connected to the IF signal lines 27 or connected via the IF signal amplifiers 42.

The extent to which circuits can be placed in the grid area 30 depends on the size of the standard cell, which is determined by the arrangement pitch of the antenna elements 11. If there is still room in the grid area 30, other than the mixer 21, components such as the 9-times multiplier 34 of the LO signal generator 31 (or a tripler or other multipliers if applicable), the final stage amplifier of the IF signal amplifier 41, the first stage amplifier of the IF signal amplifier 42, and buffer circuits (not shown) connected to the mixer 21 can be placed within the grid area 30. By placing as many circuit elements that directly supply signals to or receive signals from the mixer 21 as close to the mixer 21 as possible, the wiring distance from these circuit elements to the mixer 21 can be minimized, thereby suppressing the attenuation of signals input to or output from the mixer 21 and improving the noise figure of the transmitters and receivers.

In the above configuration, the antenna elements 11 for receiving, such as the antenna elements 11 in the odd rows of the antenna array, are not used during transmission, and the antenna elements 11 for transmitting, such as the antenna elements 11 in the even rows of the antenna array, are not used during reception, resulting in poor utilization efficiency of the antenna elements 11. Therefore, to enable the use of all antenna elements 11 for both transmission and reception, the arrangement pitch of the antenna elements 11 in the column direction can be doubled, that is, set to 600-700 μm, which provides a slight margin over one-half wavelength of the RF signal, as in the first and second embodiments. In this case, the arrangement pitch of the transmitting and receiving antenna elements 11 will be equivalent to one wavelength, but the circuit can be configured so that during transmission, the antenna elements 11 for receiving transmit RF signals with intermediate phases of the RF signals transmitted by the transmitting antenna elements 11 on either side, and during reception, the transmitting antenna elements 11 receive RF signals with intermediate phases of the RF signals received by the receiving antenna elements 11 on either side. This configuration effectively places the transmitting and receiving antenna elements 11 at an equivalent pitch of one-half wavelength.

Fifth Embodiment

Figure 7:
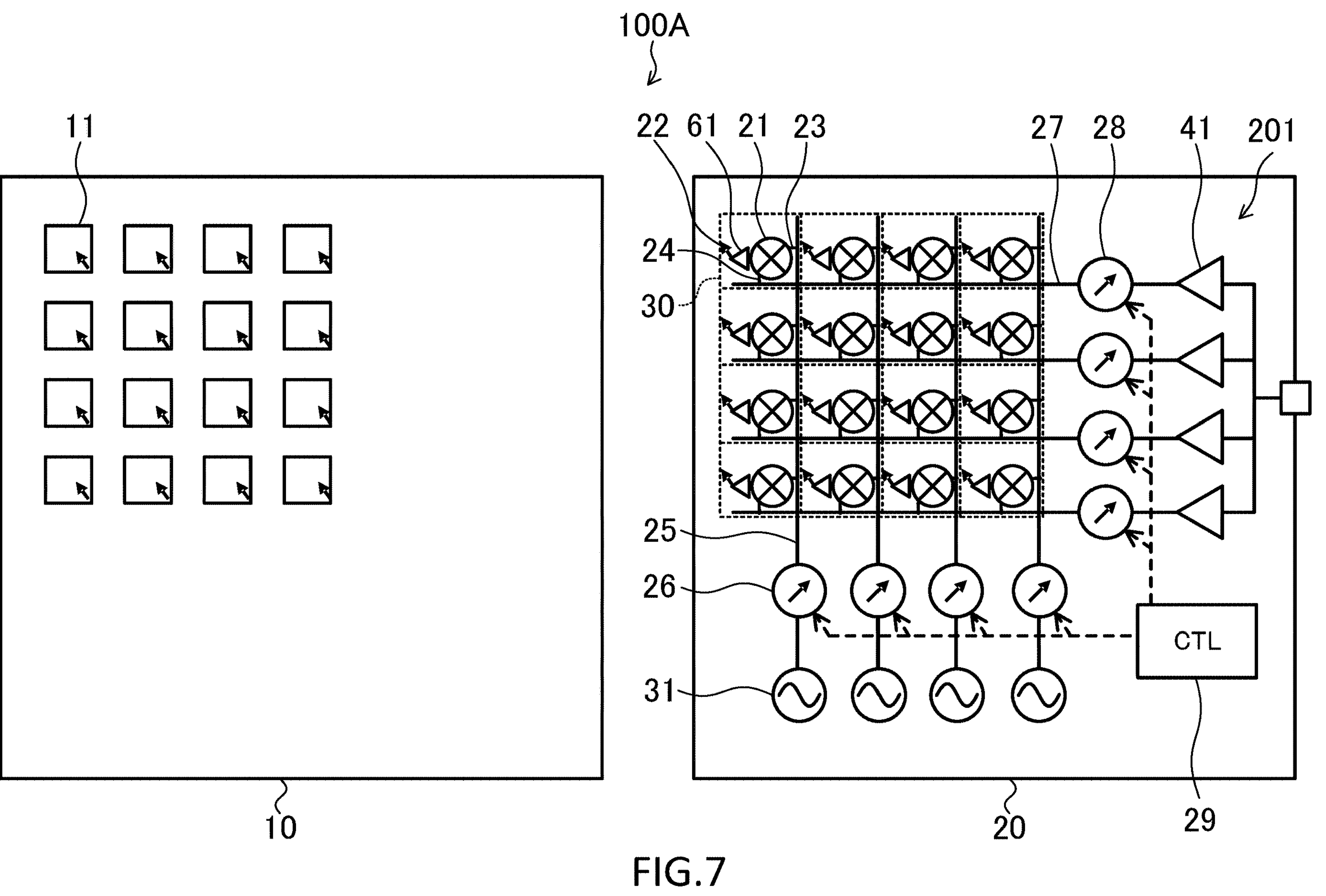
FIG. 7 is a plan view schematic diagram of an array antenna device according to the fifth embodiment of the present invention.

The semiconductor substrate 20 of the array antenna device 100 according to the first embodiment can also be composed of compound semiconductors or bipolar CMOS (BiCMOS). FIG. 7 is a plan view schematic diagram of an array antenna device according to the fifth embodiment of the present invention. In the array antenna device 100A according to this embodiment, the semiconductor substrate 20 is a compound semiconductor substrate such as GaAs, InP, InGaAlP, or a SiGe-BiCMOS substrate. Because compound semiconductors and BiCMOS have excellent high-frequency characteristics, it is possible to provide a power amplifier 61 that amplifies the 300 GHz band RF signal output from the mixer 21 between the antenna element 11 and the mixer 21. The power amplifier 61 downstream of the mixer 21 is placed in the grid area 30 along with the mixer 21.

In the case of the array antenna device 100 constructed with silicon CMOS as shown in FIG. 1, the output power per mixer 21 is relatively small, so it is necessary to use many antenna elements 11 to ensure the required transmission power. Therefore, a large number of mixer-last configuration transmitters, as shown in FIG. 2, are needed, which increases power consumption. Additionally, if there is an upper limit on the power consumption of the semiconductor substrate 20, the number of transmitters that can be operated may be limited, leading to insufficient transmission power. On the other hand, although compound semiconductors and BiCMOS are more expensive to manufacture compared to silicon CMOS, they allow for the placement of a power amplifier 61 downstream of the mixer 21 to increase the transmission power per antenna element 11. This means fewer transmitters are needed to ensure the required transmission power. In other words, compound semiconductors and BiCMOS can achieve higher transmission power with a smaller circuit scale compared to silicon CMOS, overcoming the issue of increased manufacturing costs.

Sixth Embodiment

Figure 8:
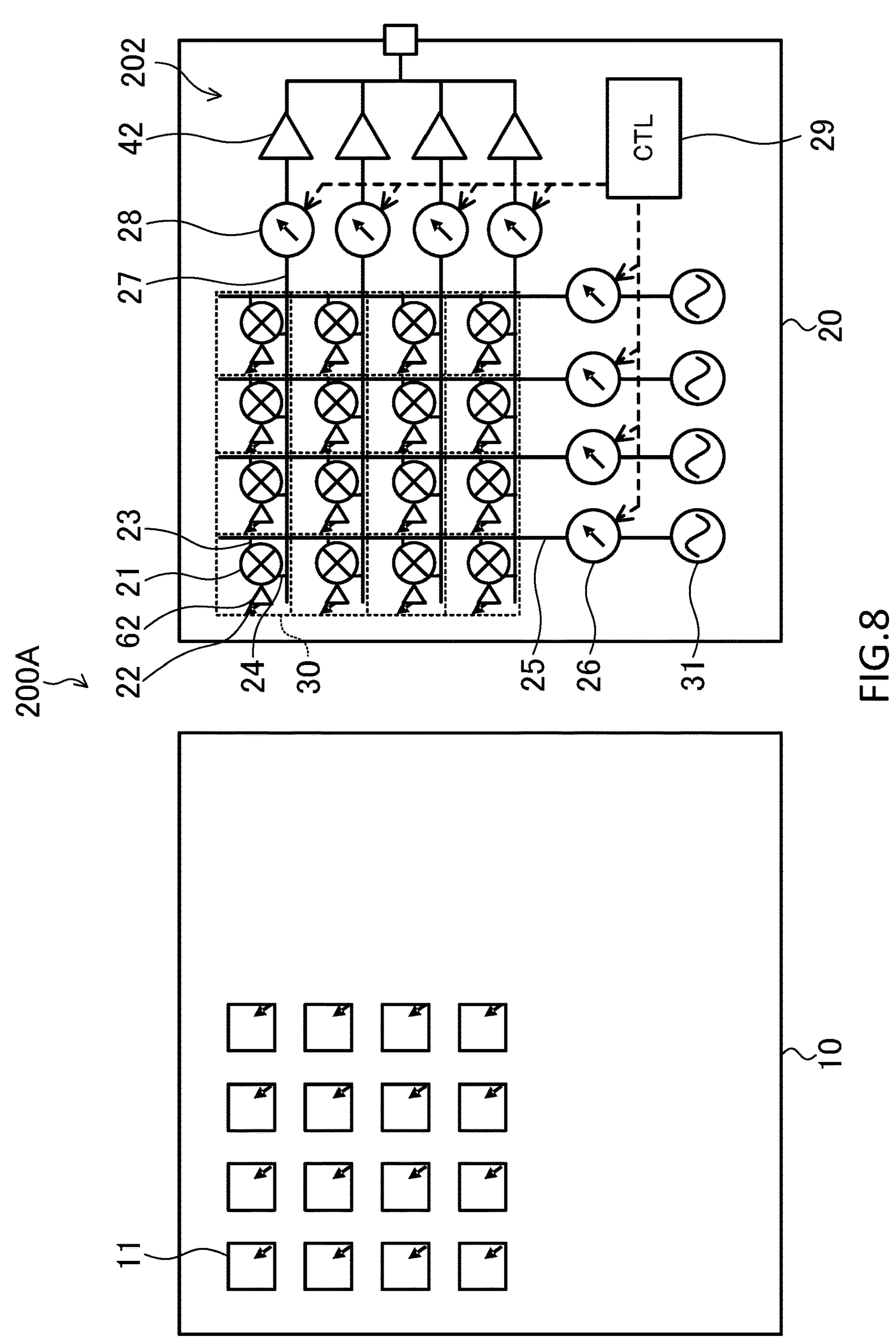
FIG. 8 is a plan view schematic diagram of an array antenna device according to the sixth embodiment of the present invention.

The semiconductor substrate 20 of the array antenna device 200 according to the second embodiment can also be composed of compound semiconductors or bipolar CMOS (BiCMOS). FIG. 8 is a plan view schematic diagram of an array antenna device according to the sixth embodiment of the present invention. In the array antenna device 200A according to this embodiment, the semiconductor substrate 20 is a compound semiconductor substrate such as GaAs, InP, InGaAlP, or a SiGe-BiCMOS substrate. Because compound semiconductors and BiCMOS have excellent high-frequency characteristics, it is possible to provide a low-noise amplifier 62 that amplifies the weak 300 GHz band RF signals received by the antenna element 11 between the antenna element 11 and the mixer 21. The low-noise amplifier 62 upstream of the mixer 21 is placed in the grid area 30 along with the mixer 21.

In the case of the array antenna device 200 constructed with silicon CMOS as shown in FIG. 2, the power of the RF signals input to each mixer 21 is relatively small, so it is necessary to use many antenna elements 11 to ensure the required reception power. Therefore, a large number of mixer-first configuration receivers, as shown in FIG. 4, are needed, which increases power consumption. Additionally, if there is an upper limit on the power consumption of the semiconductor substrate 20, the number of receivers that can be operated may be limited, leading to insufficient reception power. On the other hand, although compound semiconductors and BiCMOS are more expensive to manufacture compared to silicon CMOS, they allow for the placement of a low-noise amplifier 62 upstream of the mixer 21 to increase the power of the RF signals input to the mixer 21. This means fewer receivers are needed to ensure the required reception power. In other words, compound semiconductors and BiCMOS can achieve higher reception power with a smaller circuit scale compared to silicon CMOS, overcoming the issue of increased manufacturing costs.

Seventh Embodiment

Figure 9:
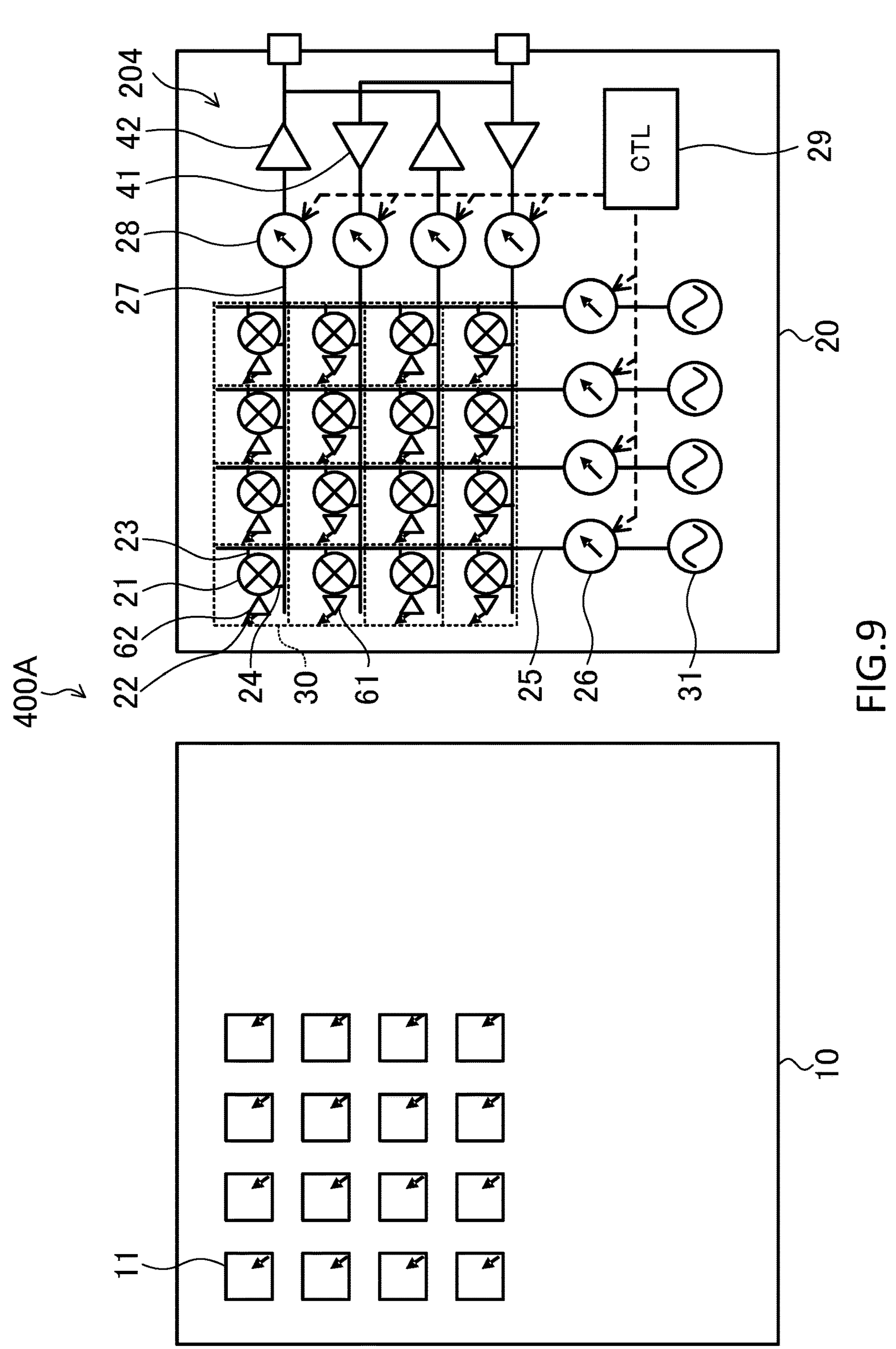
FIG. 9 is a plan view schematic diagram of an array antenna device according to the seventh embodiment of the present invention.

The semiconductor substrate 20 of the array antenna device 400 according to the fourth embodiment can also be composed of compound semiconductors or bipolar CMOS (BiCMOS). FIG. 9 is a plan view schematic diagram of an array antenna device according to the seventh embodiment of the present invention. In the array antenna device 400A according to this embodiment, the semiconductor substrate 20 is a compound semiconductor substrate such as GaAs, InP, InGaAlP, or a SiGe-BiCMOS substrate. Because compound semiconductors and BiCMOS have excellent high-frequency characteristics, for the transmitter, it is possible to provide a power amplifier 61 that amplifies the 300 GHz band RF signal output from the mixer 21 between the antenna element 11 and the mixer 21. For the receiver, it is possible to provide a low-noise amplifier 62 that amplifies the weak 300 GHz band RF signals received by the antenna element 11 between the antenna element 11 and the mixer 21. The power amplifier 61 downstream of the mixer 21 and the low-noise amplifier 62 upstream of the mixer 21 are placed in the grid area 30 along with the mixer 21.

In the case of the array antenna device 400 constructed with silicon CMOS as shown in FIG. 6, the output power per mixer 21 is relatively small, and the power of the RF signals input to each mixer 21 is also relatively small. Therefore, it is necessary to use many antenna elements 11 to ensure the required transmission and reception power. Consequently, a large number of mixer-last configuration transmitters and mixer-first configuration receivers, as shown in FIGS. 2 and 4, are needed, which increases power consumption. Additionally, if there is an upper limit on the power consumption of the semiconductor substrate 20, the number of transmitters and receivers that can be operated may be limited, leading to insufficient transmission and reception power. On the other hand, although compound semiconductors and BiCMOS are more expensive to manufacture compared to silicon CMOS, they allow for the placement of a power amplifier 61 downstream of the mixer 21 to increase the transmission power per antenna element 11 and a low-noise amplifier 62 upstream of the mixer 21 to increase the power of the RF signals input to the mixer 21. This means fewer transmitters and receivers are needed to ensure the required transmission and reception power. In other words, compound semiconductors and BiCMOS can achieve higher transmission and reception power with a smaller circuit scale compared to silicon CMOS, overcoming the issue of increased manufacturing costs.

Variation

The mixers 21 or 51 do not need to be placed directly below the antenna elements 11. They only need to be positioned appropriately within the grid areas 30. In this sense, the mixers 21 or 51 do not have to be arranged at equal intervals and can be arranged in a staggered pattern, for example.

The LO signal lines 25 or LO signal lines 55 do not need to be arranged at equal intervals. For example, two LO signal lines 25 or LO signal lines 55 may be placed between the first and second rows of mixers 21 or mixers 51, and the remaining two LO signal lines 25 or LO signal lines 55 may be placed between the third and fourth rows of mixers 21 or mixers 51. Similarly, the IF signal lines 27 or IF signal lines 57 do not need to be arranged at equal intervals. For example, two IF signal lines 27 or IF signal lines 57 may be placed between the first and second rows of mixers 21 or mixers 51, and the remaining two IF signal lines 27 or IF signal lines 57 may be placed between the third and fourth rows of mixers 21 or mixers 51. This ensures circuit placement space for a total of four grid areas 30, two in the vertical direction and two in the horizontal direction, allowing other circuit elements besides mixers 21 or mixers 51 to be placed within the grid areas 30.

The antenna elements 11 may be mounted on the redistribution layer (RDL) of the semiconductor substrate 20 instead of on the printed circuit board 10. This allows the array antenna device to be implemented on a single chip.

It goes without saying that the number of antenna elements 11 is not limited to 16 in a 4×4 configuration. Increasing the number of antenna elements 11 can increase the antenna gain. For example, increasing the number of antenna elements 11 to 1024 in a 32×32 configuration would result in the antenna gain being 64 times greater than with 16 elements, according to a simple calculation. When there are many antenna elements 11, the increased length of the LO signal lines 25 or LO signal lines 55 and the IF signal lines 27 or IF signal lines 57 may lead to significant signal attenuation at the ends of the lines. Therefore, buffer circuits may be appropriately placed at suitable points along the signal lines to ensure that signals of sufficient strength can be transmitted to the ends. Additionally, the LO phase shifters 26 may be connected directly to the LO signal lines 25 or through buffer circuits.

If it is sufficient for the RF signal to sweep in only one direction, the phase shift amount of either the LO phase shifter or the IF phase shifter may be fixed. Alternatively, one of the LO phase shifters or IF phase shifters may be omitted, and in this case, the signal line from which the phase shifter is omitted may have a signal with either the same phase or a predetermined phase difference connected to it.

If sweeping the RF signal is not necessary and beamforming in a specific direction is sufficient, the controller may be omitted and the phase amounts of the LO phase shifters and IF phase shifters may be fixed. Alternatively, both the LO phase shifters and IF phase shifters may be omitted, and the LO signal lines and IF signal lines may have LO signals and IF signals with either the same phase or a predetermined phase difference connected to them.

Figure 10:
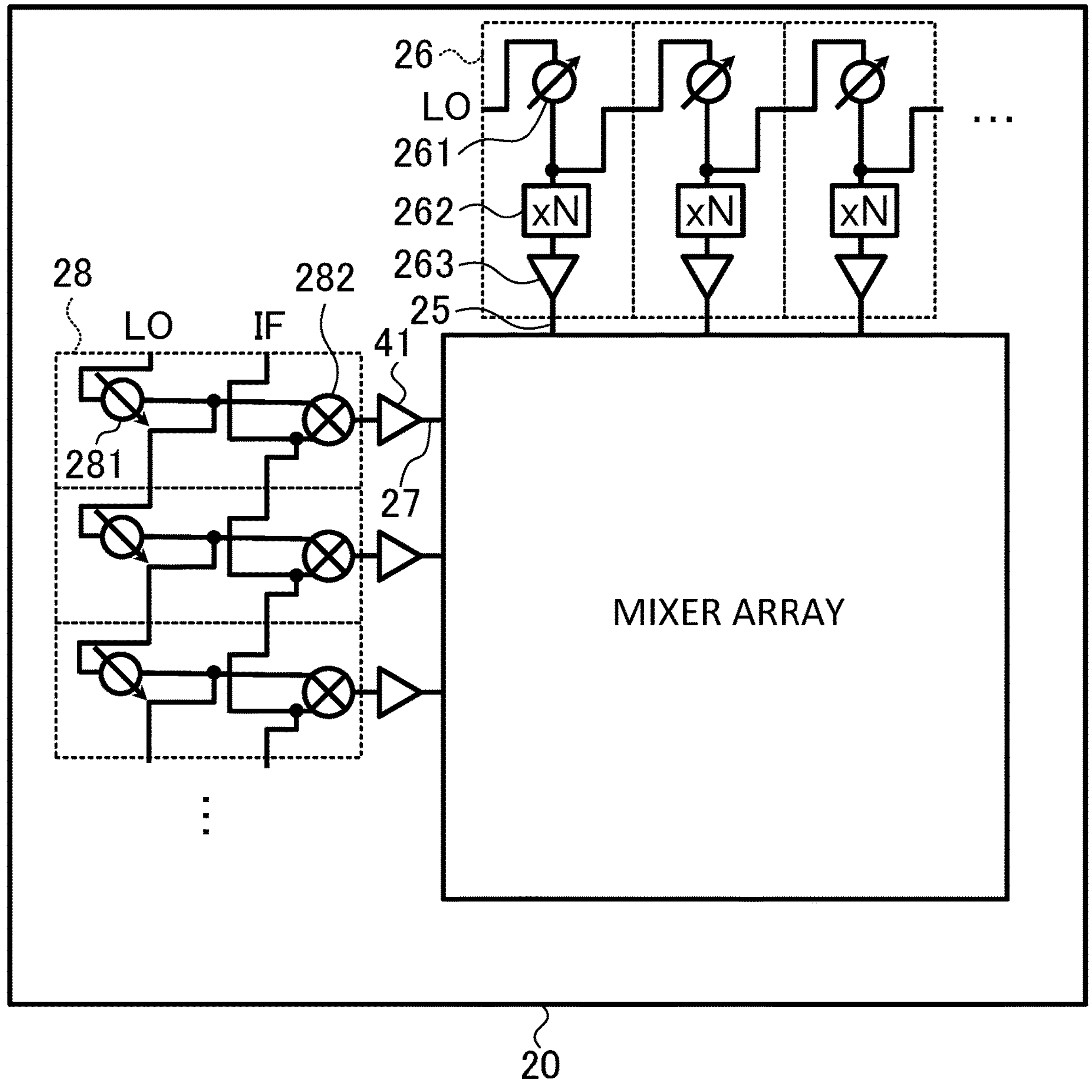
FIG. 10 is a plan view schematic diagram of an example of a transmitter semiconductor substrate corresponding to a scalable configuration.

By serially connecting the circuit elements of the LO phase shifters 26, IF phase shifters 28, LO phase shifters 56, and IF phase shifters 58 in the above embodiments, the array antenna devices can be configured to be scalable. FIG. 10 is a plan view schematic diagram of an example of a transmitter semiconductor substrate corresponding to a scalable configuration. For convenience, FIG. 10 does not show the mixers 21 and the power amplifiers 61 for compound semiconductors as depicted in FIGS. 1 and 7, labeling them as "mixer array," nor does it show the controller 29. On the semiconductor substrate 20, a plurality of LO phase shifters 26 is aligned and serially connected in the row direction at the same pitch as the row-wise arrangement pitch of the mixers (not shown) in the mixer array. The first LO phase shifter 26 (the leftmost one in the example of FIG. 10) receives an LO signal from an LO signal generator (not shown). The LO phase shifter 26 includes a phase shifter 261, a frequency multiplier 262, and a buffer circuit 263. The LO signal input to the LO phase shifter 26 is phase-adjusted by the phase shifter 261 and split into two. One part is amplified twofold by a buffer circuit (not shown) and input to the frequency multiplier 262, while the other part is amplified twofold by another buffer circuit (not shown) and input to the next LO phase shifter 26. The phase shift amount by the phase shifter 261 is controlled by the controller (not shown). The LO signal input to the frequency multiplier 262 has its frequency multiplied and is supplied to the LO signal line 25 via the buffer circuit 263. Similarly, on the semiconductor substrate 20, a plurality of IF phase shifters 28 is aligned and serially connected in the column direction at the same pitch as the column-wise arrangement pitch of the mixers (not shown) in the mixer array. The first IF phase shifter 28 (the topmost one in the example of FIG. 10) receives an IF signal and an LO signal from an LO signal generator (not shown). The IF phase shifter 28 includes a phase shifter 281 and a mixer 282. The LO signal input to the IF phase shifter 28 is phase-adjusted by the phase shifter 281 and split into two. One part is amplified twofold by a buffer circuit (not shown) and input to the mixer 282, while the other part is amplified twofold by another buffer circuit (not shown) and input to the next IF phase shifter 28. The IF signal input to the IF phase shifter 28 is split into two. One part is amplified twofold by a buffer circuit (not shown) and input to the mixer 282, while the other part is amplified twofold by another buffer circuit (not shown) and input to the next IF phase shifter 28. In the mixer 282, the IF signal and the phase-adjusted LO signal are mixed to generate a phase-adjusted IF signal. This phase-adjusted IF signal is amplified by the IF signal amplifier 41 and supplied to the IF signal line 27.

Figure 11:
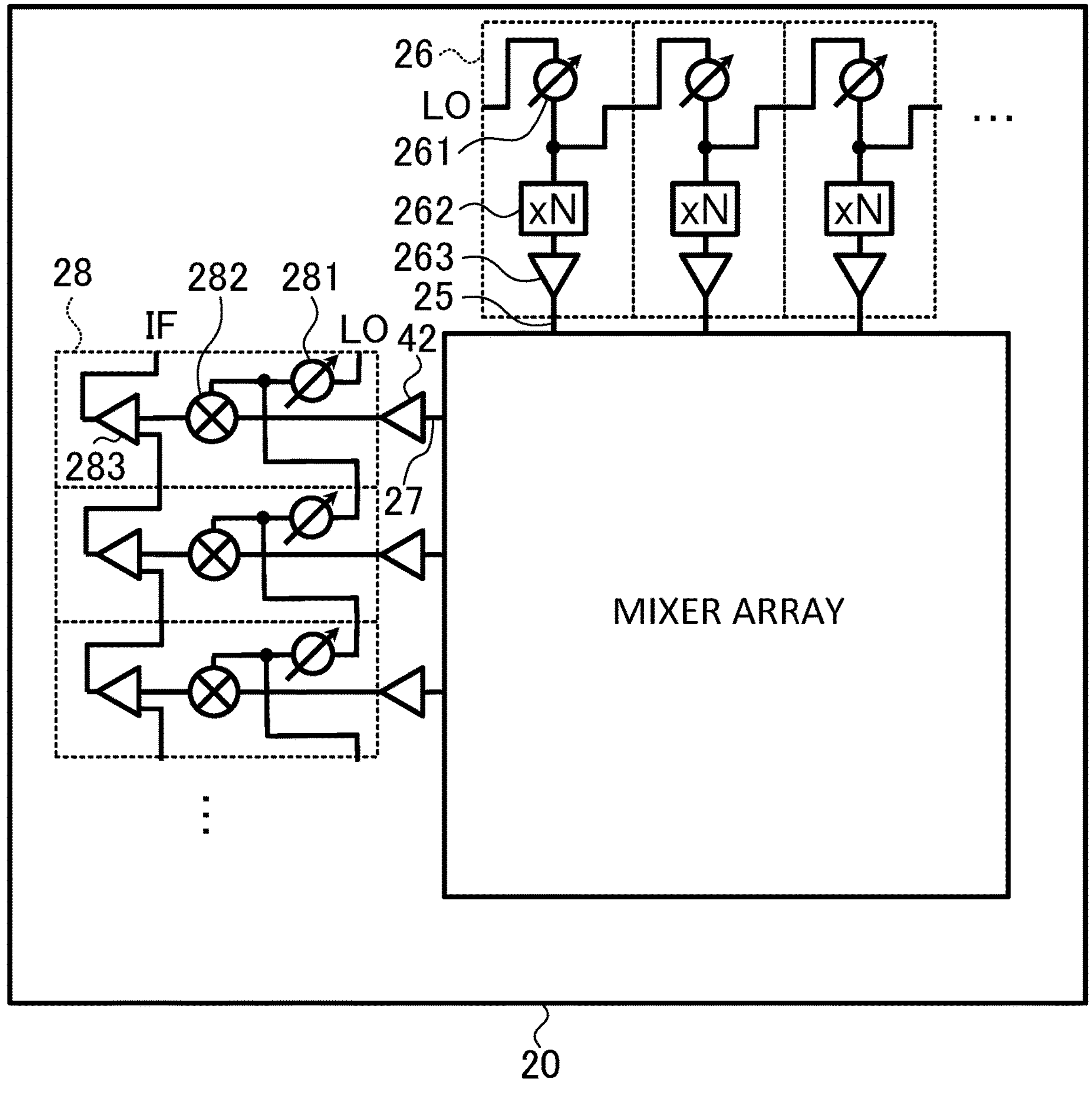
FIG. 11 is a plan view schematic diagram of an example of a receiver semiconductor substrate corresponding to a scalable configuration.
Figure 12:
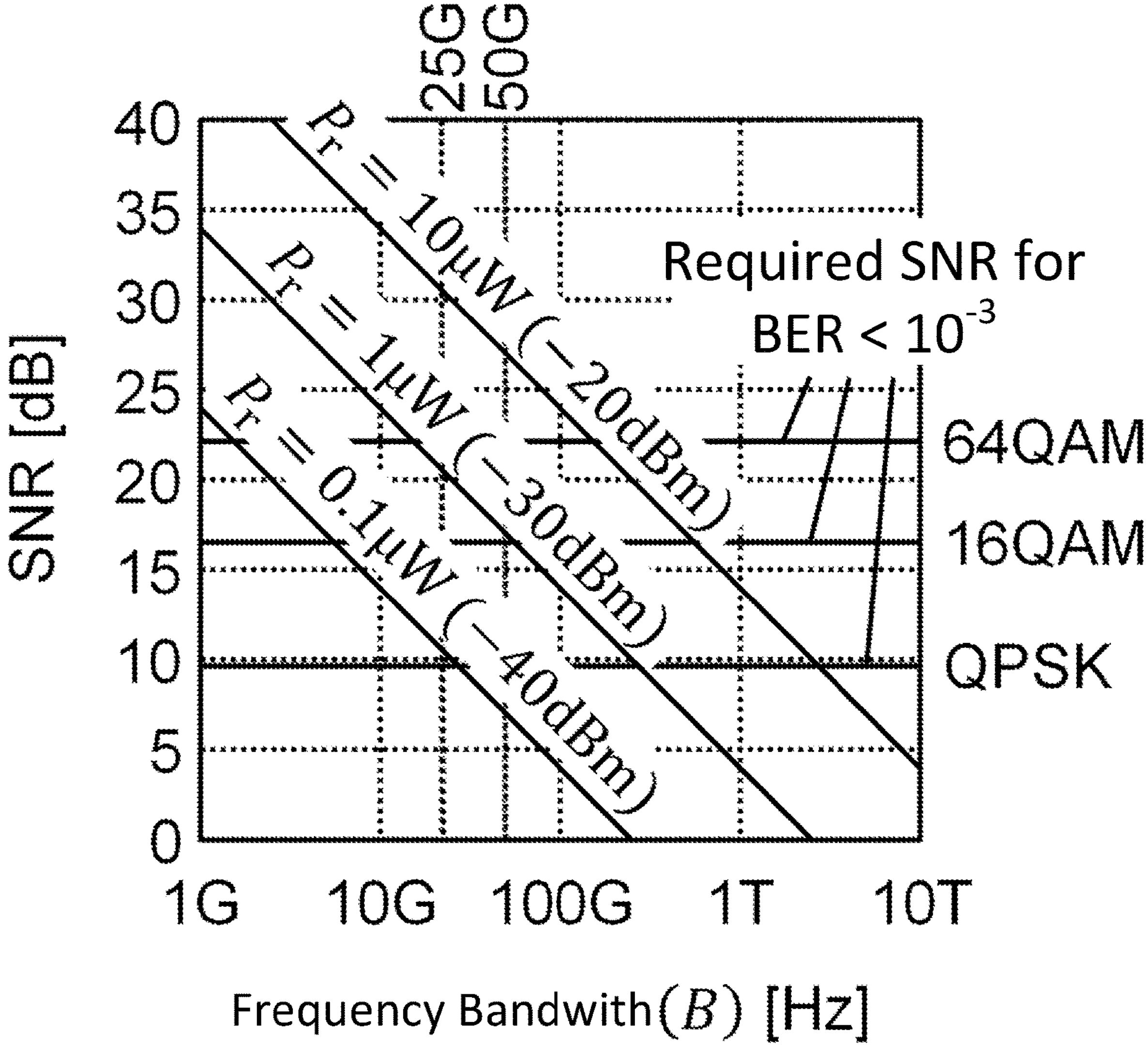
FIG. 12 is a graph illustrating the relationship between frequency bandwidth and S/N ratio for each received power level.

FIG. 11 is a plan view schematic diagram of an example of a receiver semiconductor substrate corresponding to a scalable configuration. For convenience, FIG. 11 does not show the mixers 21 and the low noise amplifiers 62 for compound semiconductors as depicted in FIGS. 3 and 8, labeling them as "mixer array," nor does it show the controller 29. On the semiconductor substrate 20, a plurality of LO phase shifters 26 is aligned and serially connected in the row direction at the same pitch as the row-wise arrangement pitch of the mixers (not shown) in the mixer array. The configuration of the LO phase shifters 26 is as described with reference to FIG. 10. On the semiconductor substrate 20, a plurality of IF phase shifters 28 is aligned and serially connected in the column direction at the same pitch as the column-wise arrangement pitch of the mixers (not shown) in the mixer array. The first IF phase shifter 28 (the topmost one in the example of FIG. 11) receives an IF signal amplified by the IF signal amplifier 42, an LO signal from an LO signal generator (not shown), and an IF signal output from the next IF phase shifter 28. The IF phase shifter 28 includes a phase shifter 281, a mixer 282, and a power coupler 283. The LO signal input to the IF phase shifter 28 is phase-adjusted by the phase shifter 281 and split into two. One part is amplified twofold by a buffer circuit (not shown) and input to the mixer 282, while the other part is amplified twofold by another buffer circuit (not shown) and input to the next IF phase shifter 28. The IF signal input to the IF phase shifter 28 is input to the mixer 282, where the IF signal and the phase-adjusted LO signal are mixed to generate a phase-adjusted IF signal. The power coupler 283 receives the phase-adjusted IF signal and the IF signal output from the next IF phase shifter 28, power-coupling these IF signals and outputting them. In other words, the IF signal output from the last IF phase shifter 28 is successively input to the previous IF phase shifters 28 and cumulatively power-coupled, resulting in the reception IF signal being output from the first IF phase shifter 28.

In FIGS. 10 and 11, the LO signal phase-adjusted by the phase shifter 261 or the phase shifter 281 is split into two, with one part being input to the next stage phase shifter 261 or phase shifter 281. However, it may also be arranged so that the LO signal is split into two before phase adjustment, with one part input to its own phase shifter 261 or phase shifter 281 and the other part input to the next stage phase shifter 261 or phase shifter 281. Additionally, following the above variation, the array antenna devices with an integrated transceiver as shown in FIGS. 6 and 9 can be configured to be scalable.

As described above, embodiments of the present invention have been explained as examples of the technology. For this purpose, attached drawings and detailed explanations have been provided. Therefore, among the components described in the attached drawings and detailed explanations, there may be components that are not essential for solving the problem but are included to illustrate the above technology. Accordingly, the presence of these non-essential components in the attached drawings or detailed explanations should not immediately be taken as an indication that these non-essential components are essential. Furthermore, since the above-described embodiments are for illustrating the technology of the present invention, various modifications, replacements, additions, and omissions can be made within the scope of the claims and their equivalents.

INDUSTRIAL APPLICABILITY

The array antenna device according to the present invention can be widely used not only for the 300 GHz band but also for wireless communication devices and wireless sensors that use the terahertz band of 100 GHz or higher.

REFERENCE SIGNS LIST

100, 200, 300, 400, 100A, 200A, 400A Array antenna device
10 Printed circuit board (first layer)
11 Antenna element
20 Semiconductor substrate (second layer)
30 Grid area
21 Mixer
22 RF signal terminal
23 LO signal terminal
24 IF signal terminal
25 LO signal line
26 LO phase shifter
27 IF signal line
28 IF phase shifter
29 Controller
50 Photonic-electronic substrate (second layer)
51 Mixer
55 LO signal line
56 LO phase shifter
57 IF signal line
58 IF phase shifter
59 Controller

The invention claimed is:

1. An array antenna device, comprising:

a first layer in which a plurality of antenna elements is arranged in a grid pattern; and a second layer stacked on the first layer, wherein the second layer includes:

a plurality of mixers disposed in a plurality of grid areas overlapping with the plurality of antenna elements in plan view, each mixer including an LO signal terminal, an IF signal terminal, and an RF signal terminal, the RF signal terminals being electrically connected to the plurality of antenna elements, a plurality of LO signal lines provided for each column of the plurality of mixers, the LO signal terminals of the mixers in a same column being commonly connected to the LO signal lines, and a plurality of IF signal lines provided for each row of the plurality of mixers, the IF signal terminals of the mixers in a same row being commonly connected to the IF signal lines, wherein the second layer includes a plurality of phase shifters connected to at least one of the plurality of LO signal lines and the plurality of IF signal lines, and the plurality of phase shifters is disposed outside the plurality of grid areas.

2. The array antenna device according to claim 1, wherein the second layer includes a controller that controls signal phase adjustment by the phase shifters, and the controller is disposed outside the plurality of grid areas.

3. The array antenna device according to claim 1, wherein the plurality of phase shifters is connected in series.

4. The array antenna device according to claim 3, wherein the plurality of phase shifters is arranged at a same pitch as the plurality of mixers.

5. The array antenna device according to claim 1, wherein the plurality of LO signal lines is arranged in parallel at equal intervals.

6. The array antenna device according to claim 1, wherein the plurality of IF signal lines is arranged in parallel at equal intervals.

7. The array antenna device according to claim 1, wherein the first layer is a printed circuit board, and the second layer is a semiconductor substrate.

8. The array antenna device according to claim 7, wherein the semiconductor substrate is a compound semiconductor substrate or BiCMOS, and amplifiers are provided between the antenna elements and the mixers, the amplifiers being disposed in the grid regions.

9. The array antenna device according to claim 7, wherein the array antenna device is a transceiver integrated device.

10. The array antenna device according to claim 9, wherein the semiconductor substrate is a compound semiconductor substrate or BiCMOS, and amplifiers are provided between the antenna elements and the mixers, the amplifiers being disposed in the grid regions.

11. An array antenna device, comprising:

a first layer in which a plurality of antenna elements is arranged in a grid pattern; and a second layer stacked on the first layer, wherein the second layer includes:

a plurality of mixers disposed in a plurality of grid areas overlapping with the plurality of antenna elements in plan view, each mixer including an LO signal terminal, an IF signal terminal, and an RF signal terminal, the RF signal terminals being electrically connected to the plurality of antenna elements, a plurality of LO signal lines provided for each column of the plurality of mixers, the LO signal terminals of the mixers in a same column being commonly connected to the LO signal lines, and a plurality of IF signal lines provided for each row of the plurality of mixers, the IF signal terminals of the mixers in a same row being commonly connected to the IF signal lines, wherein:

the first layer is a printed circuit board, the second layer is a photo-electronic substrate, the mixers are Uni-Travelling Carrier Photodiodes, and signals connected to the LO signal lines and the IF signal lines are optical signals.

* * * * *